US010660230B2

(12) United States Patent
Kuroiwa et al.

(10) Patent No.: US 10,660,230 B2
(45) Date of Patent: May 19, 2020

(54) ELECTRONIC CONTROL DEVICE INCLUDING A THERMAL MASS ELEMENT

(71) Applicant: Hitachi Automotive Systems, Ltd., Hitachinaka-shi, Ibaraki (JP)

(72) Inventors: Nobuyuki Kuroiwa, Takasaki (JP); Hiroyuki Saito, Hitachinaka (JP); Kazuhiko Nakano, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 16/465,434

(22) PCT Filed: Nov. 28, 2017

(86) PCT No.: PCT/JP2017/042613
§ 371 (c)(1),
(2) Date: May 30, 2019

(87) PCT Pub. No.: WO2018/101257
PCT Pub. Date: Jun. 7, 2018

(65) Prior Publication Data
US 2020/0008314 A1 Jan. 2, 2020

(30) Foreign Application Priority Data
Dec. 2, 2016 (JP) ................. 2016-235166

(51) Int. Cl.
*H05K 7/14* (2006.01)
*H01H 50/12* (2006.01)
(Continued)

(52) U.S. Cl.
CPC ........... *H05K 7/1432* (2013.01); *H01H 45/04* (2013.01); *H01H 45/12* (2013.01); *H01H 50/12* (2013.01);
(Continued)

(58) Field of Classification Search
CPC .. H05K 7/1432; H05K 7/20845; H05K 5/006; H05K 5/0213; H05K 7/20854;
(Continued)

(56) References Cited

U.S. PATENT DOCUMENTS 9,136,080 B2 * 9/2015 Sumino ................. H01H 50/20
9,338,925 B2 * 5/2016 Nakano ............... B62D 5/0406
(Continued)

FOREIGN PATENT DOCUMENTS

JP    2004-135396 A    4/2004
JP    2006-21552 A    1/2006
(Continued)

OTHER PUBLICATIONS

International Search Report (PCT/ISA/210) issued in PCT Application No. PCT/JP2017/042613 dated Feb. 27, 2018 with English translation (five (5) pages).
(Continued)

*Primary Examiner* — James Wu
(74) *Attorney, Agent, or Firm* — Crowell & Moring LLP

(57) ABSTRACT

An electronic control device includes a relay including a relay case and an electromagnet and a contact part. The relay case is structured to contain the electromagnet and the contact part. The contact part is structured to be opened and closed by action of the electromagnet. A connector terminal is electrically connected to the relay. A circuit board is structured to mount the relay and the connector terminal thereon. An exterior shell is structured to contain the circuit board such that the connector terminal is exposed outside the exterior shell. A thermal mass element is disposed in a wiring route between the relay and the connector terminal.

8 Claims, 16 Drawing Sheets

(51) Int. Cl.
*H01H 45/04* (2006.01)
*H01H 45/12* (2006.01)
*H02G 3/16* (2006.01)
*H02K 11/33* (2016.01)
*H05K 5/00* (2006.01)
*H05K 7/20* (2006.01)

(52) U.S. Cl.
CPC ............... *H02G 3/16* (2013.01); *H02K 11/33* (2016.01); *H05K 5/006* (2013.01); *H05K 7/20845* (2013.01); *H01H 2239/036* (2013.01)

(58) Field of Classification Search
CPC .......... H02G 3/16; H01H 45/12; H01H 45/04; H01H 50/12; H01H 2239/036; H02K 11/33
See application file for complete search history.

(56) References Cited

U.S. PATENT DOCUMENTS 9,370,126 B2 *  6/2016  Hashikura ........... B60R 16/0238
2006/0006749 A1   1/2006  Sasaki et al.
2010/0163302 A1   7/2010  Hashikura et al.
2013/0058044 A1   3/2013  Watanabe et al.

FOREIGN PATENT DOCUMENTS

| JP | 2009-283255 A | 12/2009 |
| JP | 2013-70028 A | 4/2013 |
| JP | 2014-79093 A | 5/2014 |
| JP | 2016-58495 A | 4/2016 |
| WO | WO 2009/008366 A1 | 1/2009 |

OTHER PUBLICATIONS

International Preliminary Report on Patentability (PCT/IB/338, PCT/IB/373 and PCT/ISA/237) issued in PCT Application No. PCT/JP2017/042613 dated Jun. 13, 2019, including English translation of Japanese-language Written Opinion (PCT/ISA/237) (10) pages).

* cited by examiner

ELECTRONIC CONTROL DEVICE INCLUDING A THERMAL MASS ELEMENT

TECHNICAL FIELD

The present invention relates to an electronic control device including an electromagnetic relay.

BACKGROUND ART

Patent Document 1 discloses a relay that includes a relay case containing an electromagnet and a contact part, wherein the relay case is configured to form heat radiation panels at its ceiling apart from the contact part in order to suppress dew condensation from occurring at the contact part. This configuration sets the ceiling of the relay case lower in temperature than a vicinity of the contact part, and thereby makes moisture inside the relay case condense at the ceiling instead of the contact part.

Patent Documents 2 discloses, as a conventional art, a relay configured such that a top face of a relay case is in contact with a chassis of a vehicle via a thermal conductive sheet for outwardly radiating heat generated inside the relay while the relay is ON.

When an electronic control device whose relay is electrically connected to a connector terminal via a wiring route such as a bus bar is used in an extremely cold area, the connector terminal is cooled by outside air after a stop of device operation, and draws heat from a contact part of the relay, and causes the contact part to undergo a sudden drop in temperature. Thus, even in a configuration that a relay case is partially cooled as in Patent Document 1 or 2, a contact part is liable to antecedently drop in temperature and undergo dew condensation.

PRIOR ART DOCUMENT(S)

Patent Document(s)

Patent Document 1: JP 2009-283255 A
Patent Document 2: JP 2014-79093 A

SUMMARY OF THE INVENTION

According to the present invention, a thermal mass element is provided in a wiring route between a connector terminal and a relay.

Further according to the present invention, the provision of the thermal mass element serves to slower a drop in temperature of a contact part when the connector terminal is cooled by outside air after a stop of device operation. This suppresses dew condensation from occurring at the contact part inside a relay case.

MODE(S) FOR CARRYING OUT THE INVENTION

The following describes an electronic control device of an electric brake booster according to a first embodiment of the present invention in detail with reference to the drawings.

Figure 1:
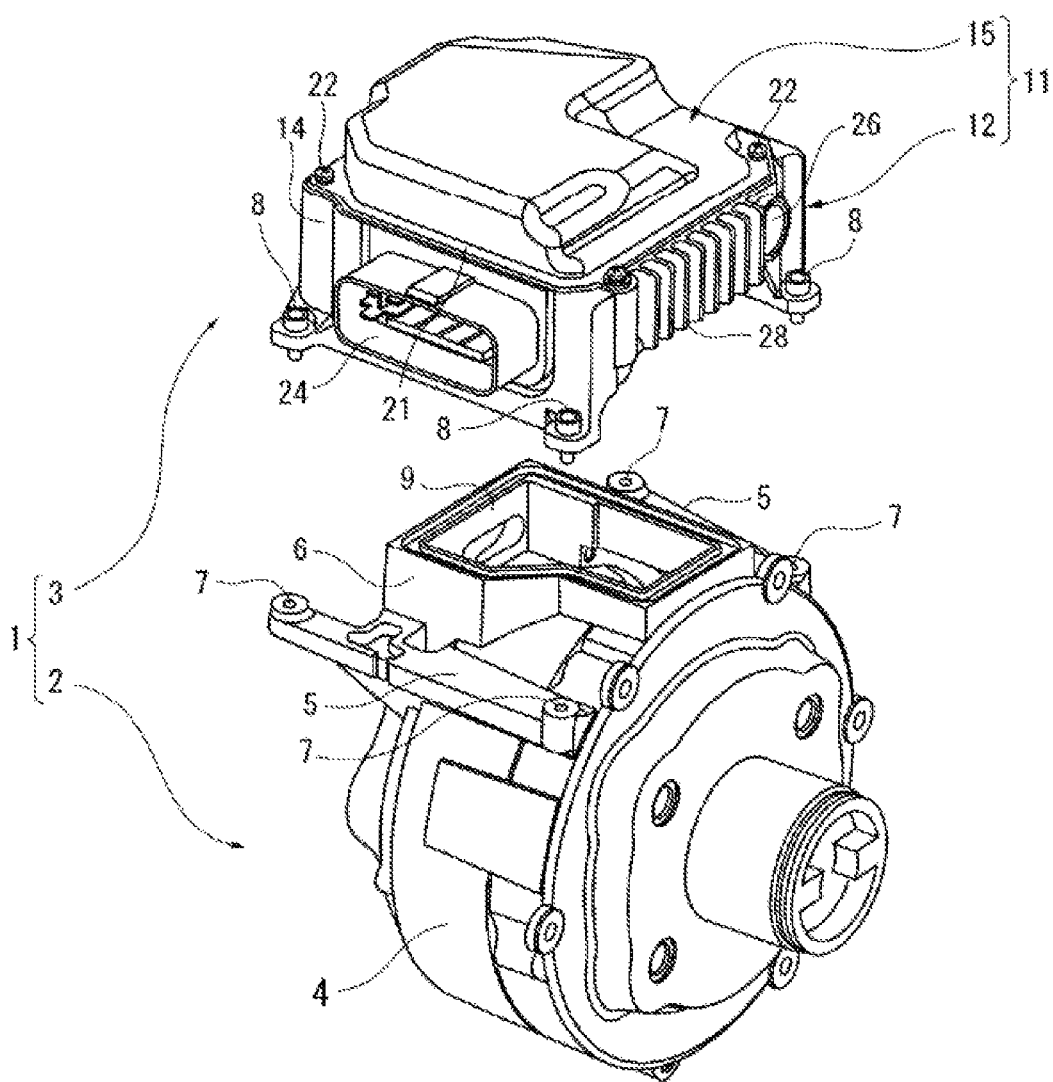
FIG. 1 is an exploded perspective view of an electric brake booster including a motor control device according to a first embodiment of the present invention.
Figure 2:
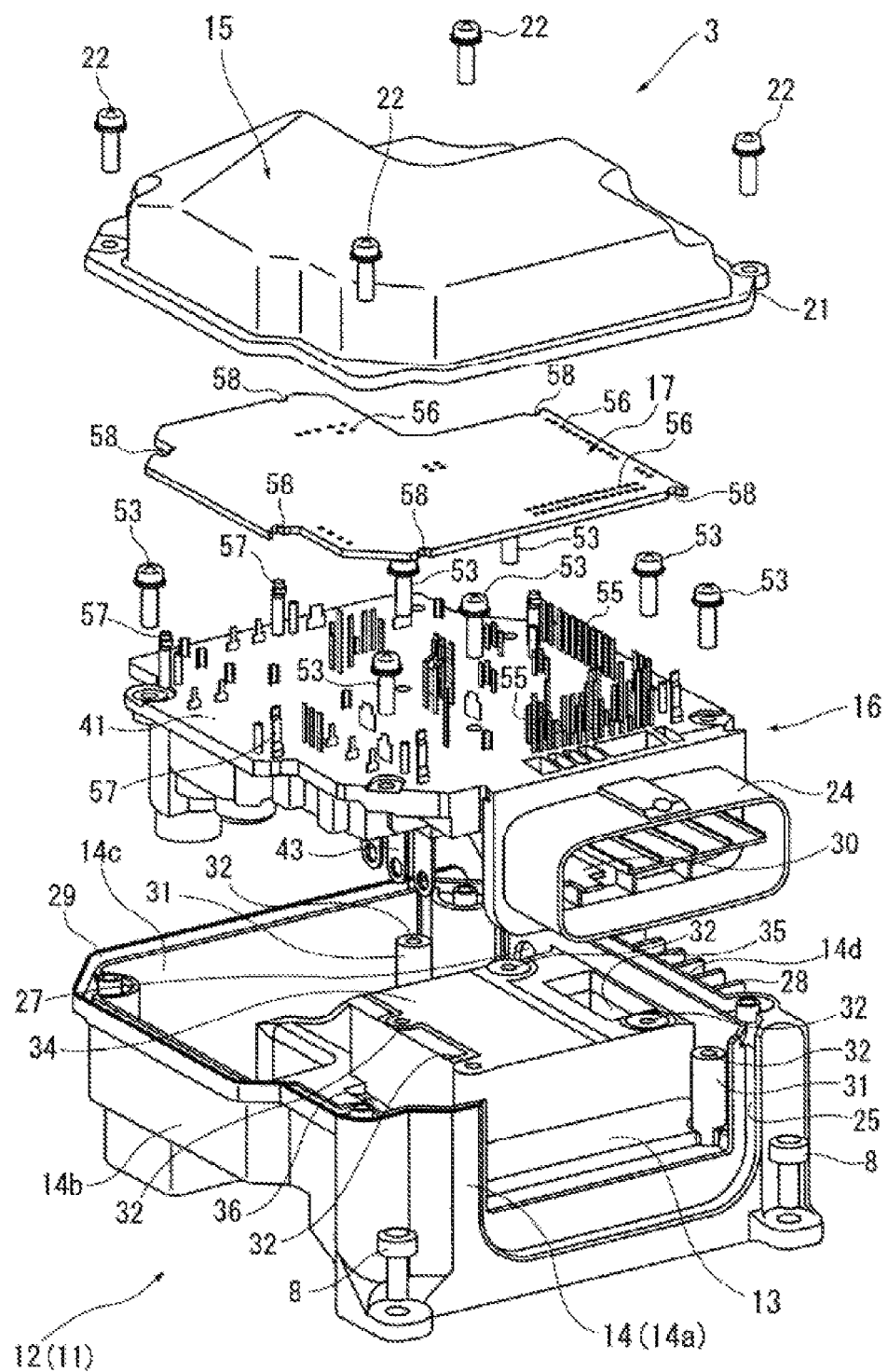
FIG. 2 is an exploded perspective view of the motor control device according to the first embodiment.

FIG. 1 is an exploded perspective view of an electric brake booster 1 including a motor control device 3, wherein motor control device 3 corresponds to the electronic control device according to the present invention. FIG. 2 is an exploded perspective view of motor control device 3.

Electric brake booster 1 shown in FIG. 1 is mounted to an engine room side of a dash panel not shown, the dash panel serving as a partition between an engine room and a vehicle interior of an automotive vehicle, and forms a booster mechanism for driving a master cylinder not shown in response to depression of a brake pedal mounted to a vehicle interior side of the dash panel. Electric brake booster 1 includes an electric motor 2 and motor control device 3, wherein: electric motor 2 drives a piston not shown of the master cylinder in an axial direction of the piston via a ball screw mechanism; and motor control device 3 controls the driving of electric motor 2 on the basis of driver's brake operation and/or a driving state of the vehicle.

Electric motor 2 includes a motor housing 4, a pair of bases 5, and a controller mount seat 6, wherein: motor housing 4 is made of a metallic material such as an aluminum alloy and has a cylindrical shape; bases 5 and controller mount seat 6 are formed on an outer periphery of motor housing 4; and controller mount seat 6 is located between bases 5. Motor control device 3 is placed on controller mount seat 6, and is attached and fixed to motor housing 4 by putting controller mount screws 8 into screw holes 7 of bases 5, wherein controller mount screws 8 are provided at four corners of motor control device 3. Controller mount seat 6 has a substantially rectangular wall shape and includes an opening 9 surrounded by the wall shape. Through this opening 9, electric motor 2 and motor control device 3 are electrically connected to each other.

FIG. 1 shows electric brake booster 1 in an attitude substantially the same as when mounted in the engine room of the vehicle. In this attitude, motor control device 3 is loaded on an upper face of motor housing 4.

As shown in FIG. 2, motor control device 3 includes a housing 11 serving as an exterior shell. Housing 11 is composed of a case 12 and a cover 15, which are respectively a lower part and an upper part of housing 11 when mounted in the vehicle. Case 12 has a substantially rectangular shape in a plan view, and includes a bottom wall 13 and a peripheral wall 14, and includes an upper face having an opening facing upward. Cover 15 has a substantially rectangular shape in a plan view and is structured to enclose the opening of the upper face of case 12. Housing 11 contains a power module 16 serving as a circuit board and a control module 17 composed of another circuit board. In detail, power module 16 is located nearer to bottom wall 13 of case 12 than control module 17, and control module 17 is stacked over power module 16 with a predetermined interval therebetween.

Cover 15 is formed by press-molding a metallic plate to have a substantially dish-like shape, and includes in its rim a flange 21 structured to be joined to an upper end of peripheral wall 14 of case 12, and swells from flange 21 in a direction opposite to case 12 so as to contain control module 17. Cover 15 is fixed on case 12 by cover mount screws 22 provided at four corners of cover 15.

Figure 3:
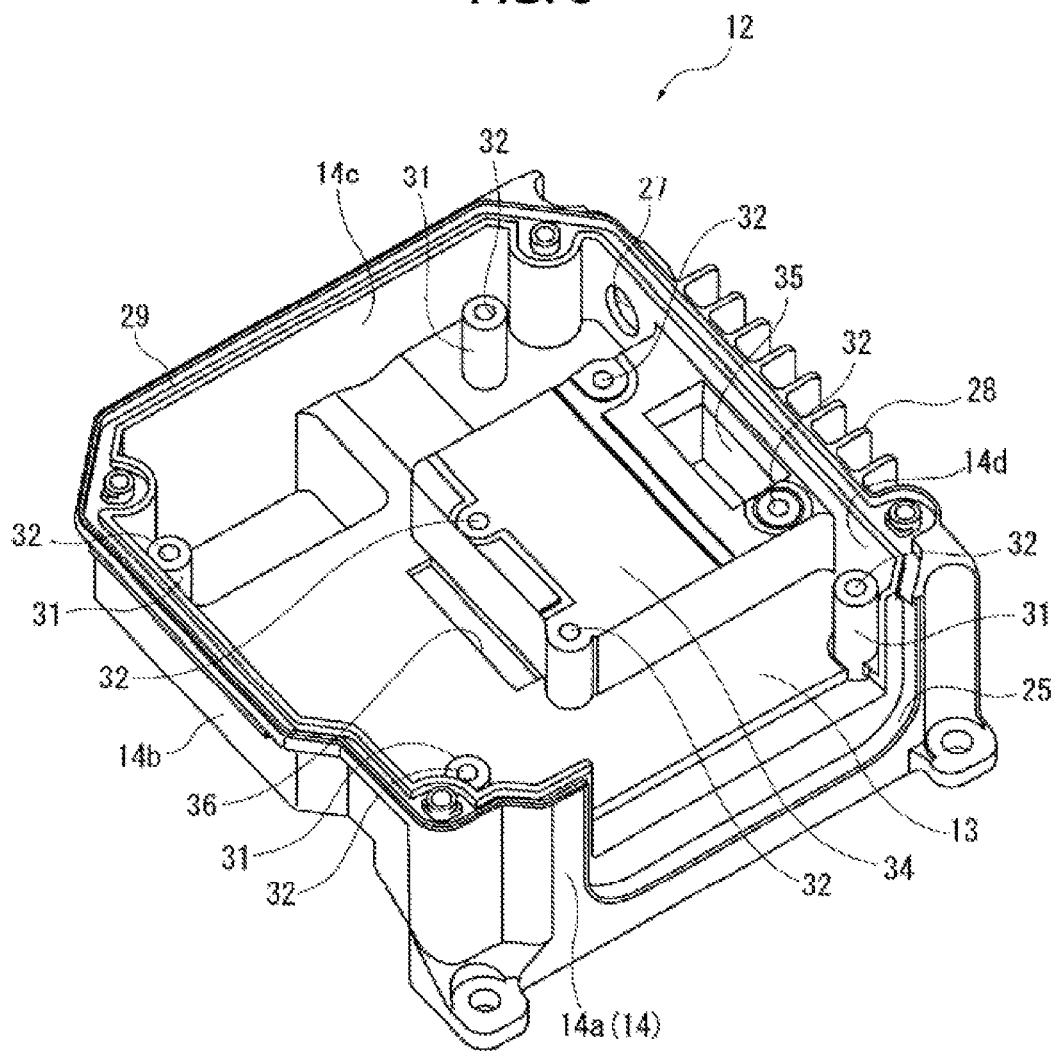
FIG. 3 is a perspective view of a case alone.

FIG. 3 is a perspective view of case 12 alone. Case 12 shown in FIG. 3 is formed by molding a metallic material comparatively high in thermal conductivity such as an aluminum alloy, by a so-called die-casting method. Peripheral wall 14 of case 12 has a substantially rectangular shape and is composed of a first wall 14a, a second wall 14b, a third wall 14c, and a fourth wall 14d, wherein: first wall 14a and third wall 14c face each other in a first direction; and second wall 14b and fourth wall 14d face each other in a second direction perpendicular to the first direction. Defining one side of case 12, first wall 14a includes an opening 25 that is formed by cutting to be substantially U-shaped so as to let an external connector 24 of power module 16 through. Fourth wall 14d includes in its one end a vent hole 27 formed as a circular opening into which a vent filter 26 (see FIG. 1) is fitted from the outside. Fourth wall 14d further includes cooling fins 28 formed in its outer periphery. At the upper end of peripheral wall 14, a sealing agent is applied to a seal groove 29 of peripheral wall 14 for sealing between case 12 and cover 15. Likewise, at a periphery of external connector 24 of power module 16, application of the seal agent is made for sealing between external connector 24 and case 12 and sealing between external connector 24 and cover 15.

Bottom wall 13 of case 12 includes power-module supporters 31. Each of power-module supporters 31 has a substantially cylindrical shape projecting toward cover 15, and includes a screw hole 32 at its top for mounting the power module 16.

Bottom wall 13 further includes a block projection 34 that has a shape of substantially rectangular block projecting from bottom wall 13 toward cover 15. Block projection 34 is located substantially at a center of case 12, and with respect to the rectangular peripheral wall 14, is apart from first wall 14a, second wall 14b, and third wall 14c at respectively specified distances, and is formed integrally and continuously with fourth wall 14d. Block projection 34 includes screw holes 32 at four corners of a top face of block projection 34 for mounting the power module 16.

Block projection 34 further includes a connector insertion hole 35 in its end adjacent to fourth wall 14d, wherein connector insertion hole 35 is formed as an elongated rectangular opening. In addition, between block projection 34 and second wall 14b, bottom wall 13 includes a stator-terminal insertion hole 36 formed as an opening adjacent to block projection 34. In detail, stator-terminal insertion hole 36 is formed as an elongated slit along a side wall of block projection 34, the side wall facing the second wall 14b.

Figure 4:
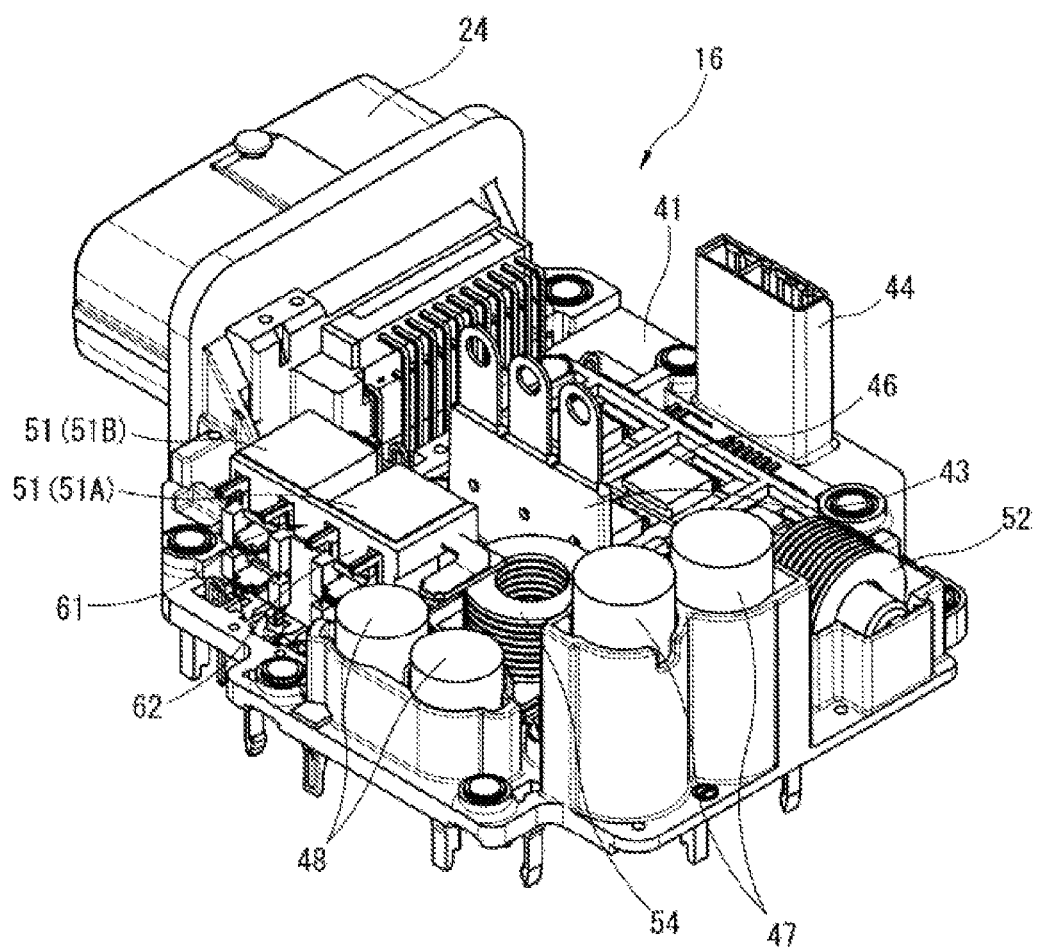
FIG. 4 is a perspective view of a power module alone, showing its component mount side.
Figure 5:
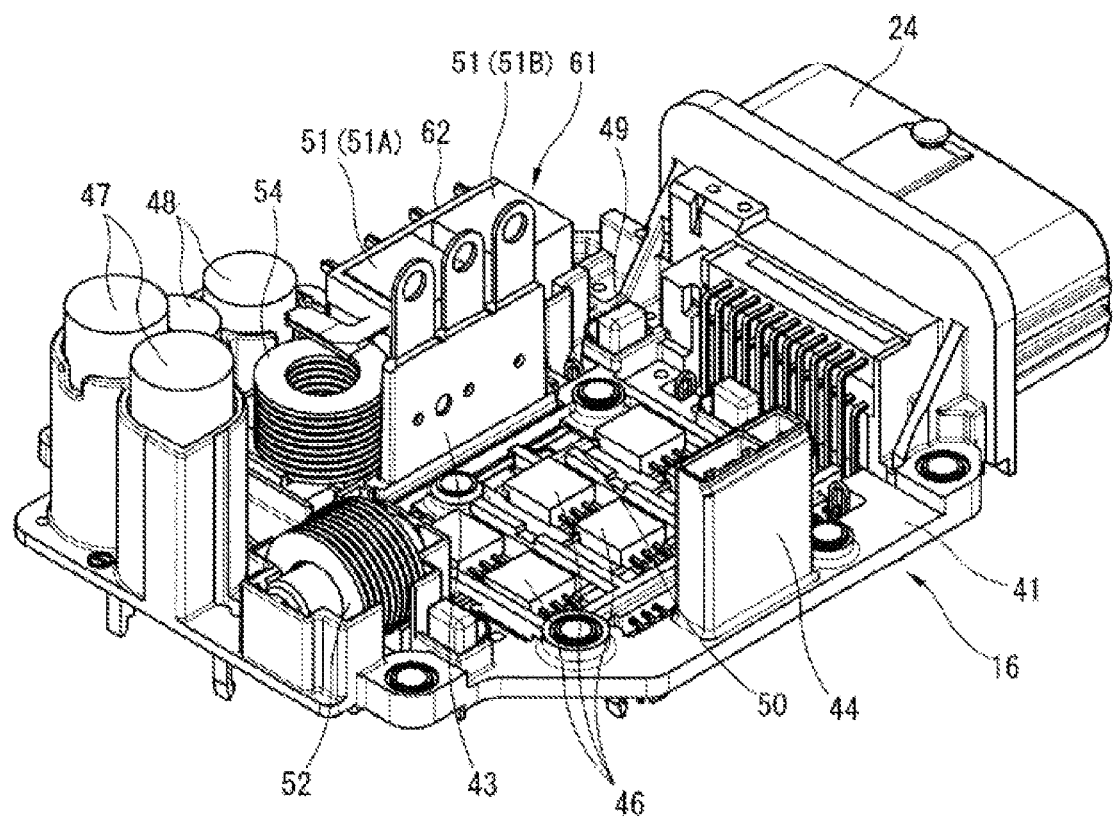
FIG. 5 is a perspective view of the power module from a point of view different from FIG. 4.
Figure 6:
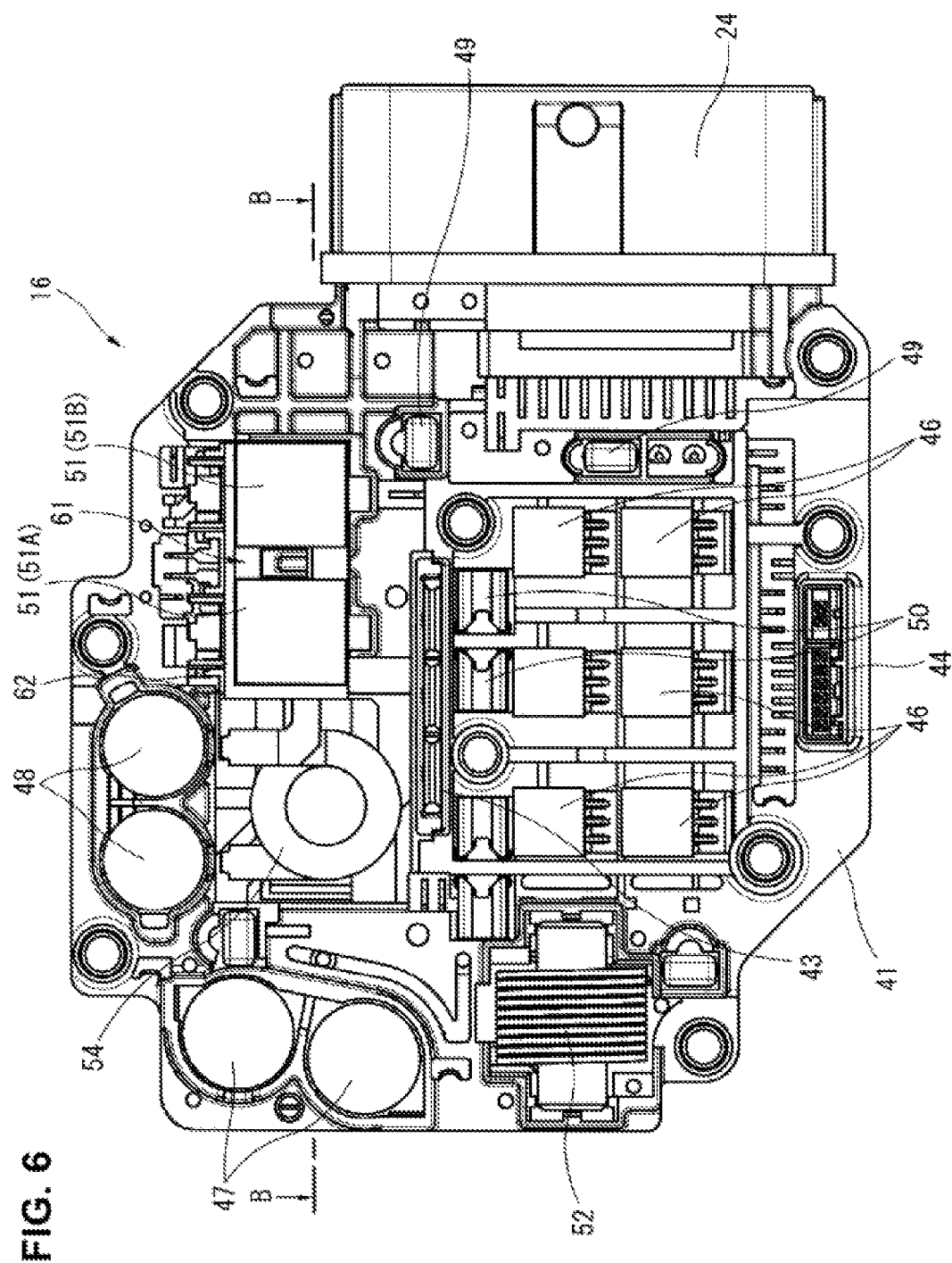
FIG. 6 is a plan view of the power module, showing the component mount side.
Figure 7:
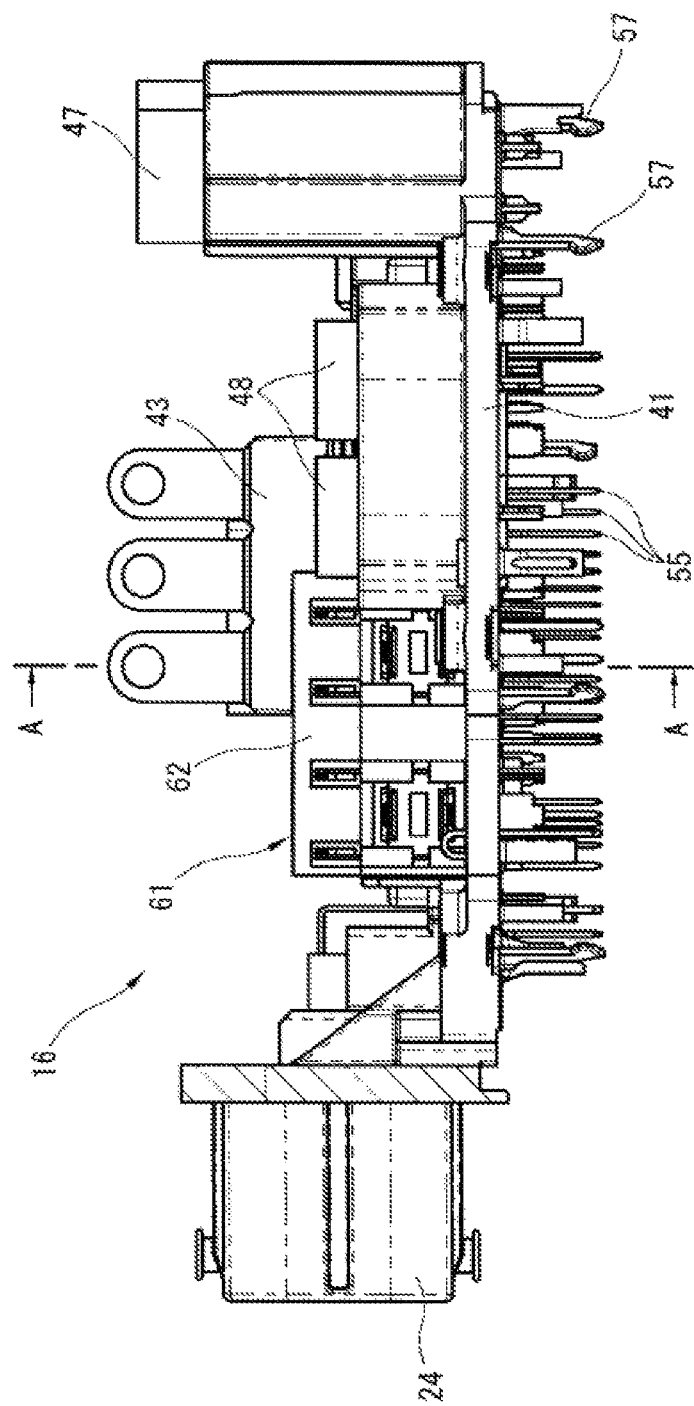
FIG. 7 is a side view of the power module.
Figure 8:
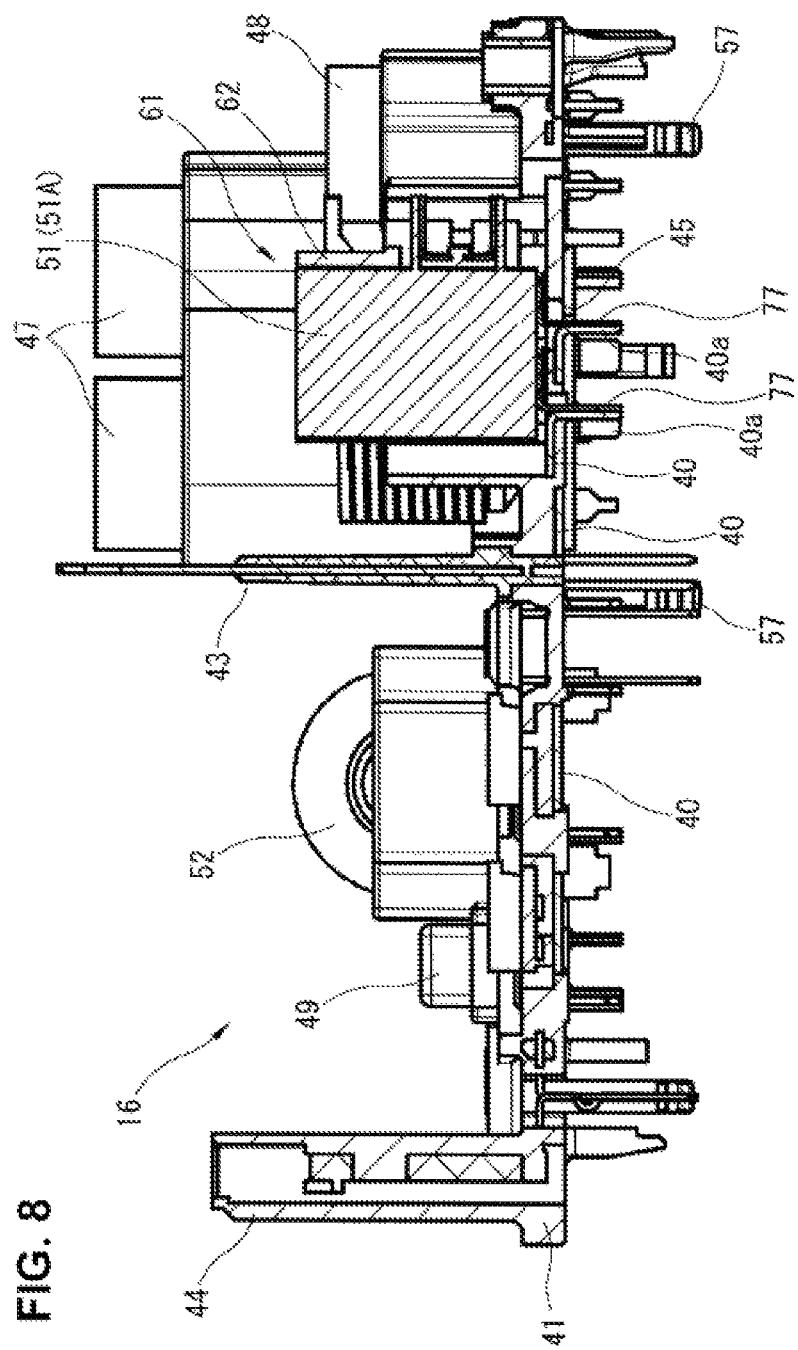
FIG. 8 is a sectional view of the power module along a line A-A in FIG. 7.
Figure 9:
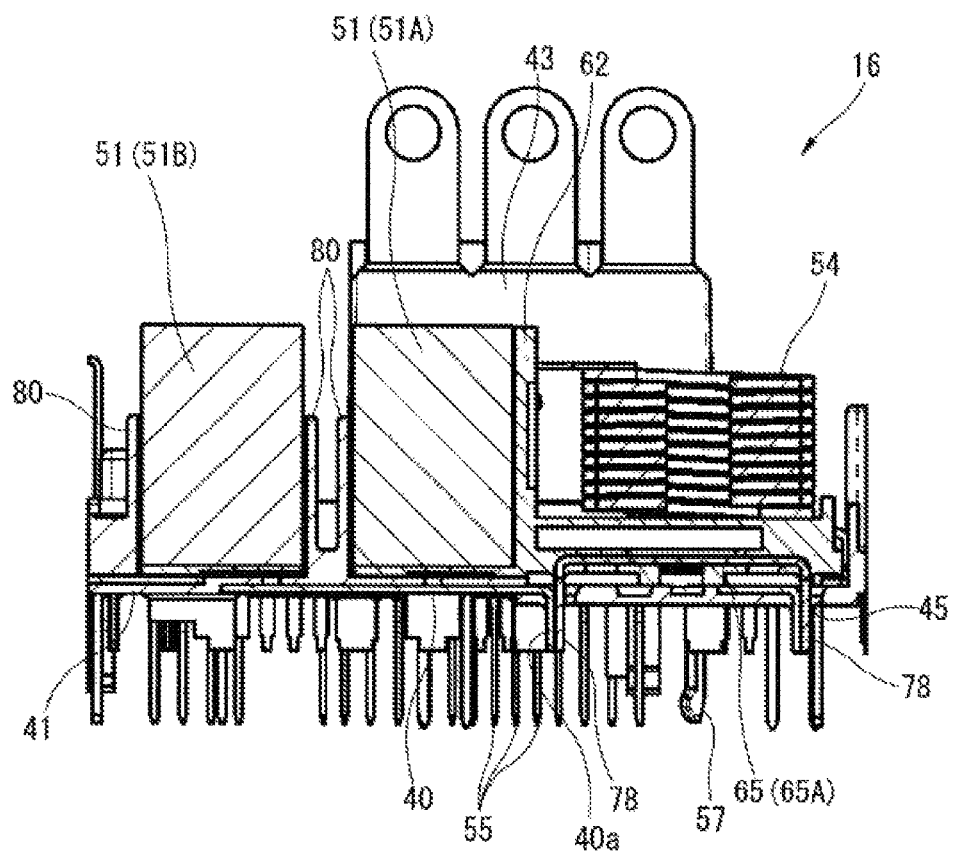
FIG. 9 is a sectional view of a relevant part of the power module along a line B-B in FIG. 6.

FIGS. 4 and 5 are perspective views of power module 16 serving as a circuit board. FIGS. 6 and 7 are respectively a plan view and a side view of power module 16. FIG. 8 is a sectional view of power module 16 along a line A-A in FIG. 7. FIG. 9 is a sectional view of a relevant part of power module 16 along a line B-B in FIG. 6. Power module 16 is formed by molding a synthetic resin material. As shown in FIGS. 4 and 5, power module 16 includes a plate base 41, external connector 24 described above, a stator-connecting terminal 43, and a sensor connector 44, wherein: plate base 41 has a shape of substantially flat plate, where many bus bars 40 (see FIGS. 8 and 9) made of metal are inserted in a surface of plate base 41 or an inside of plate base 41 so as to serve as circuit wiring; external connector 24 is formed integrally with one end of plate base 41; and stator-connecting terminal 43 and sensor connector 44 are formed to project from plate base 41 in a direction perpendicular to a plane of plate base 41. External connector 24 is exposed outward through the opening 25 of case 12 as described above, and is connected to an electronic device of the vehicle for transfer of signaling and electric power. Stator-connecting terminal 43 is located substantially at a center of plate base 41, and extends through stator-terminal insertion hole 36 of case 12 described above. Sensor connector 44 is located at a side edge of plate base 41, and extends through connector insertion hole 35 of case 12. Furthermore, stator-connecting terminal 43 and sensor connector 44 are respectively connected to a stator and a sensor of electric motor 2 through the opening 9 of controller mount seat 6 of electric motor 2.

FIGS. 4, 5, and 6 show an underside of power module 16 facing the case 12. The underside of power module 16 is a component mount side on which many electronic components (mainly relating to a power system) are mounted. The electronic components specifically include: six switching elements 46 (such as MOSFETs) provided to form a known inverter circuit for converting direct-current power to three-phase alternative-current power, wherein the direct-current power is supplied via external connector 24; a pair of first electrolytic capacitors 47 each of which has a cylindrical shape extending upright from the plane of plate base 41; a pair of second electrolytic capacitors 48 each of which has a cylindrical shape extending upright from the plane of plate base 41 similarly to first electrolytic capacitors 47 and is shorter in longitudinal direction than first electrolytic capacitors 47; ceramic capacitors 49; shunt resistors 50 for current sensing; a pair of relays 51 serving as a power breaker for circuit protection; and a normal-mode coil 52 serving as a noise filter. Six switching elements 46 are arranged together in a formation of two-by-three and mounted in an area corresponding to block projection 34 of case 12. Relays 51 are located opposite to the mount area of switching elements 46 with respect to stator-connecting terminal 43 located substantially at the center of plate base 41. Furthermore, substantially in alignment with relays 51, a thermal mass element 54 described below is provided.

One of the pair of relays 51 is a main-power-supply relay 51A structured to close and connect a power supply with the inverter circuit etc. when a main switch (a so-called key switch) of the vehicle becomes ON. The other is a backup-power-supply relay 51B structured to close and supply power in case of a failure of a main power-supply system including the main-power-supply relay 51A. Main-power-supply relay 51A includes an input side connected to a main-power-supply connector terminal 30 (see FIG. 2) of external connector 24 via bus bars 40 described above. Likewise, backup-power-supply relay 51B includes an input side connected to a backup-power-supply connector terminal not shown of external connector 24. In addition, each of FIGS. 7, 8, and 9 shows power module 16 with upward and downward directions similar to FIGS. 4 and 5, namely, shows power module 16 in an attitude that the component mount side of power module 16 is directed upward, whereas the component mount side is directed downward when in actual use (i.e. when mounted in the vehicle).

As shown in FIG. 2, power module 16 is assembled with case 12 in the attitude that the component mount side of power module 16 is directed downward, and is fixed to case 12 by putting power-module mount screws 53 into screw holes 32 of case 12. In detail, a peripheral part of power module 16 is fixed by screw holes 32 of cylindrical power-module supporters 31, and a central part of power module 16 is fixed by screw holes 32 of block projection 34. The various electronic components mounted on power module 16 are accommodated in a space formed between power module 16 and case 12. Six switching elements 46 are located close to the top face of block projection 34, and packages of switching elements 46 are joined to the top face of block projection 34 via a thermal conductive sheet not shown.

Control module 17, which is stacked above the power module 16, is composed of a printed wiring board employing a metallic board or a resin board made of a resin such as a glass epoxy resin, and includes sides on which many control-system electronic components not shown are mounted. As shown in FIG. 2, composed of the printed wiring board, control module 17 includes through holes 56 each of which is formed at a position corresponding to one of many connection terminals 55 extending upward from an upward face of power module 16. Soldering these connection terminals 55 with through holes 56 establishes intended electrical connection between control module 17 and power module 16. Power module 16 is provided with snap-fit hooks 57, each of which is formed integrally with the upward face of power module 16, and is structured to engage with a corresponding one of notches 58 formed in a rim of control module 17 and thereby fix and support the control module 17 with a predetermined spacing provided from plate base 41 of power module 16.

The following describes configuration of relays 51 and their surroundings more specifically.

According to the present embodiment, relays 51 and thermal mass element 54 are assembled beforehand as a so-called subassembly 61 on a subassembly board 62. Subassembly 61 is mounted to plate base 41 of power module 16 (specifically, to the component mount side directed downward in use).

Figure 10:
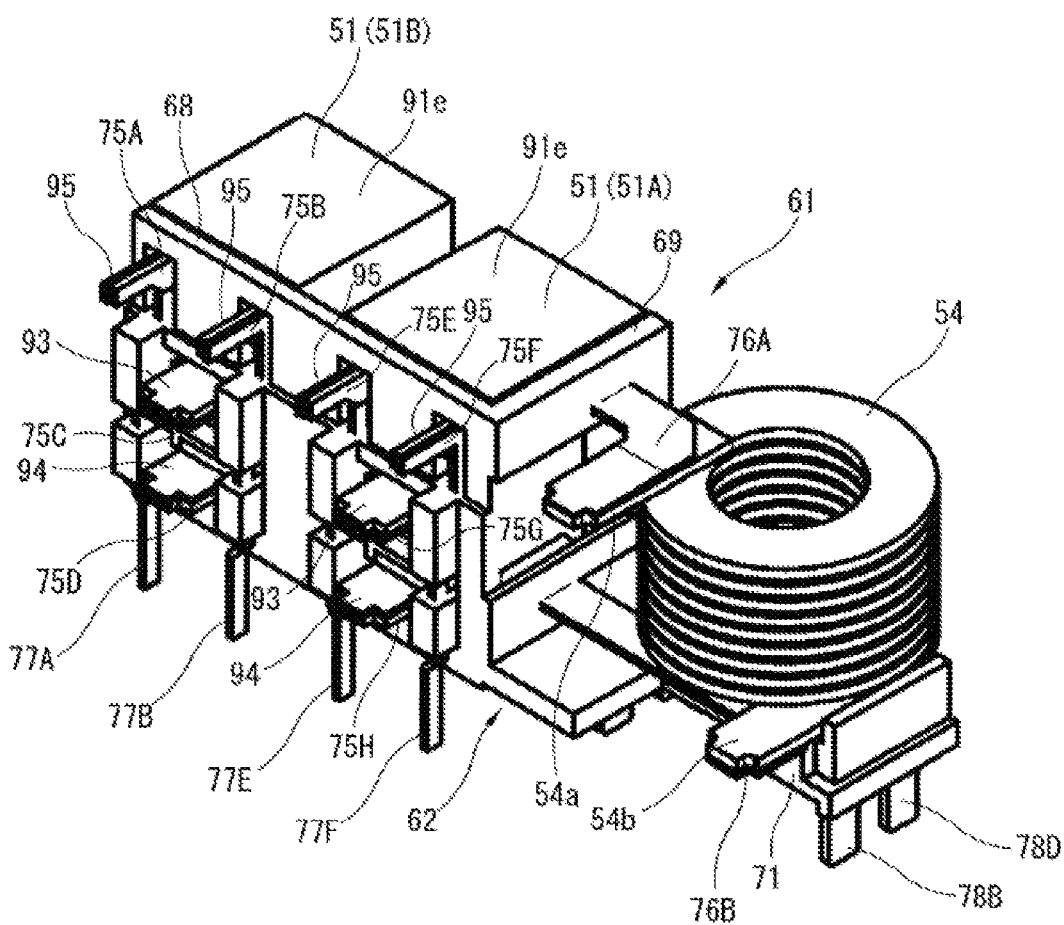
FIG. 10 is a perspective view of a subassembly.
Figure 11:
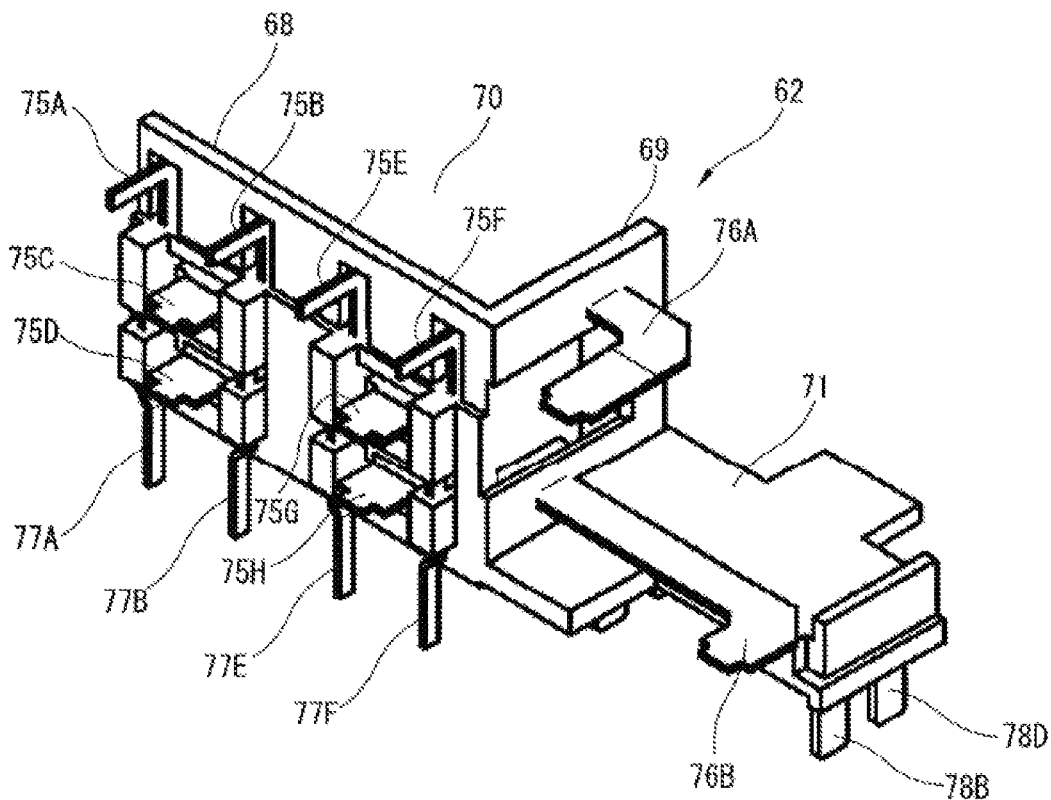
FIG. 11 is a perspective view of a subassembly board.
Figure 12:
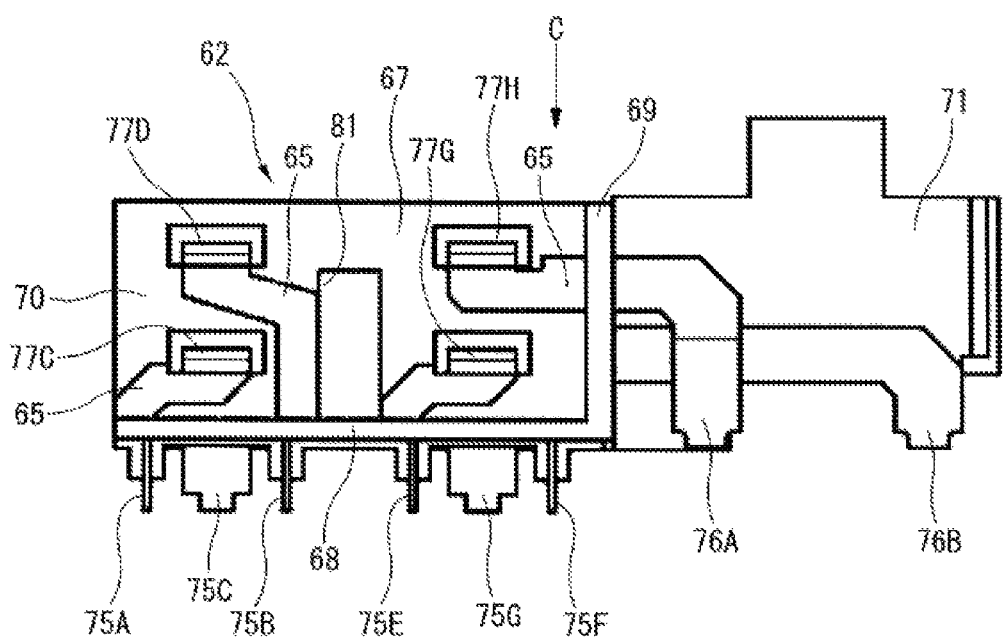
FIG. 12 is a top view of the subassembly board.
Figure 13:
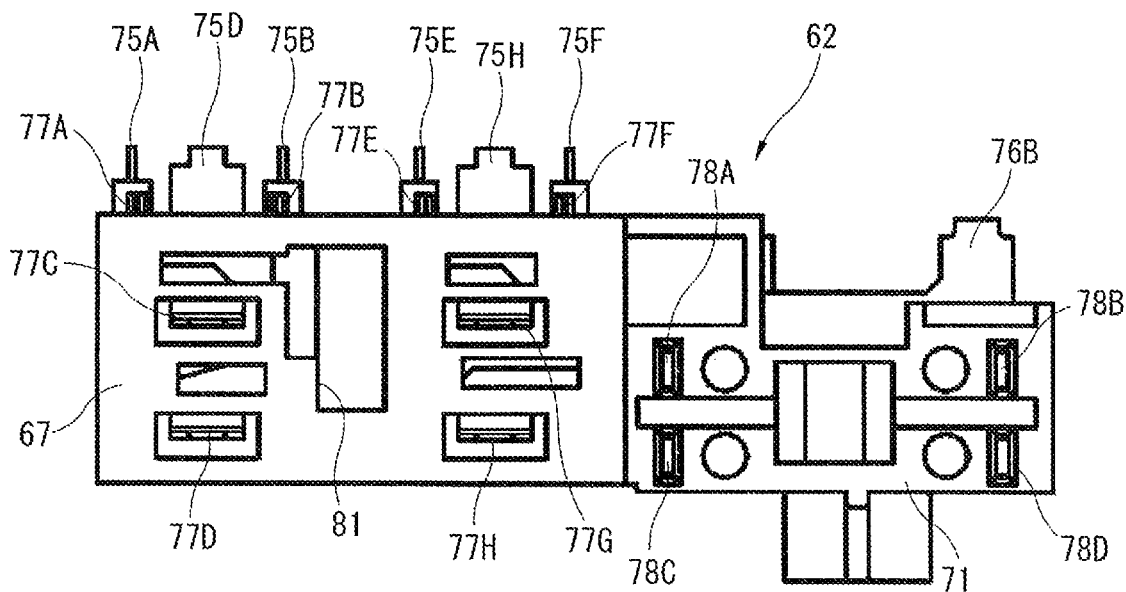
FIG. 13 is a bottom view of the subassembly board.
Figure 14:
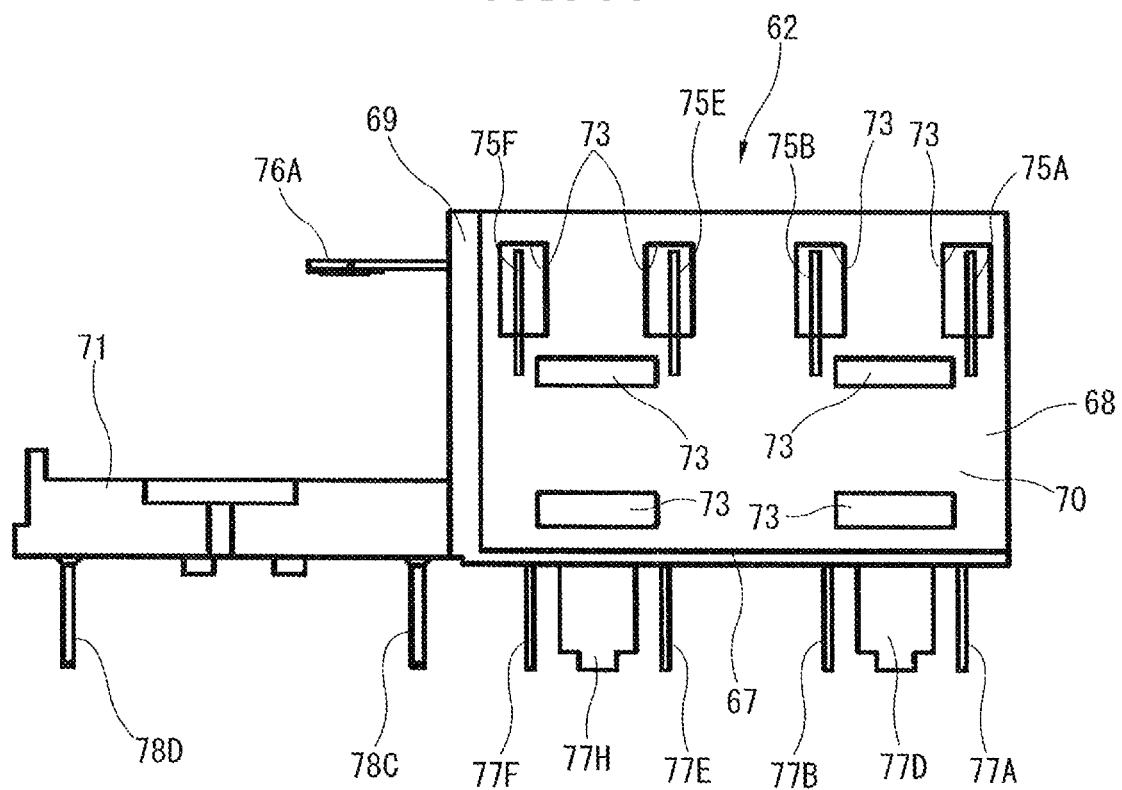
FIG. 14 is a front view of the subassembly board as viewed in a direction of an arrow C in FIG. 12.

FIG. 10 is a perspective view of subassembly 61 including relays 51 and thermal mass element 54. FIG. 11 is a perspective view of subassembly board 62 before relays 51 and thermal mass element 54 are mounted thereon. FIG. 12 is a top view of subassembly board 62. FIG. 13 is a bottom view of subassembly board 62. FIG. 14 is a front view of subassembly board 62 as viewed in a direction of an arrow C in FIG. 12. Each of FIGS. 10 to 14 shows them with upward and downward directions similar to FIGS. 7 to 9, i.e., shows them in an attitude opposite to that when in actual use (i.e. when mounted in the vehicle). In the following description, words of "up" and "down" referring to subassembly 61 are used in conformance with its attitude shown in FIGS. 10 to 14.

Subassembly board 62 is formed by molding a synthetic resin material similarly to power module 16, and includes bus bars 65 that are made of metal and are inserted, by so-called insert molding, in a surface of subassembly board 62 or an inside of subassembly board 62 so as to serve as circuit wiring. Bus bar 65 of subassembly 61 serve as a second wiring line as claimed. As shown in FIGS. 11, 12, and 13, subassembly board 62 includes: a bottom wall 67 having a rectangular shape and being structured to be stacked on plate base 41 of power module 16 when finally assembled; an erect wall 68 extending upright from one of long sides of bottom wall 67; and an end wall 69 extending upright from one of short sides of bottom wall 67. These three walls form a relay container space 70. In other words, relay container space 70 is formed by the three walls defining three faces of a rectangular prism whose remaining three faces are opened. Subassembly board 62 further includes a thermal-mass-element supporter 71 that is formed thicker than bottom wall 67 so as to have a downward face continuous with a downward face of bottom wall 67 across end wall 69.

As shown in FIG. 10, two relays 51 (main-power-supply relay 51A and backup-power-supply relay 51B) are arranged in relay container space 70 with a small gap therebetween, and thermal mass element 54 is placed on thermal-mass-element supporter 71. In detail, main-power-supply relay 51A is located nearer to thermal mass element 54, and backup-power-supply relay 51B is located farther from thermal mass element 54.

According to the first embodiment, thermal mass element 54 is composed of a coil-shaped member formed by coiling a copper wire having a flat cross section. As described below, thermal mass element 54 is interposed in series in a wiring route connecting main-power-supply relay 51A to main-power-supply connector terminal 30 so as to form a part of the wiring route. The copper wire has a surface coated with an insulator such as one made of synthetic resin. For the present invention, the thermal mass element is defined as an element that is greater in thermal capacity than a contact part of each relay 51 and is added for increase in thermal capacity. In other words, the thermal mass element is defined as an element wherein as added, the element serves to increase a thermal capacity of the wiring route extending from main-power-supply connector terminal 30 to the contact part of main-power-supply relay 51A.

Figure 15:
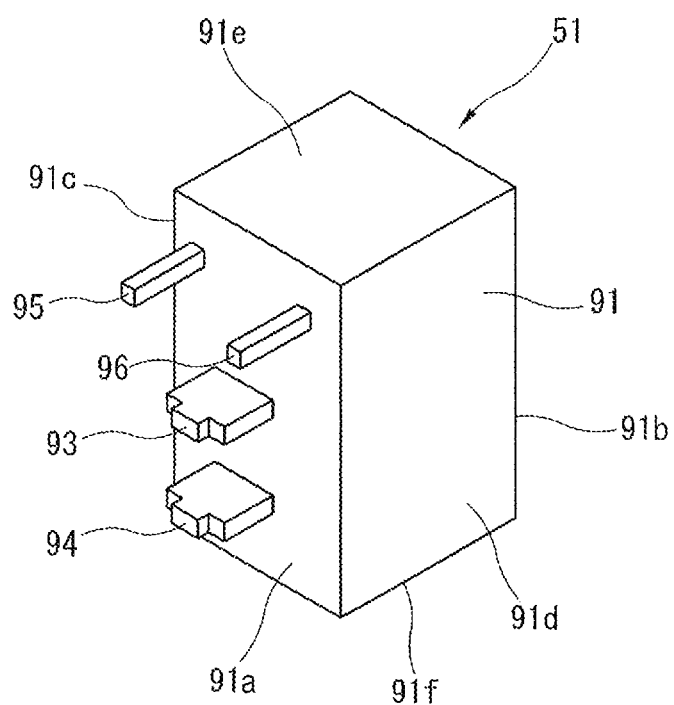
FIG. 15 is a perspective view of a relay.

FIG. 15 is a perspective view of one of two relays 51. Each relay 51 has the same basic configuration, and includes a relay case 91 that is made of synthetic resin and has a rectangular prism shape as shown in FIG. 15. Relay case 91 includes: a terminal projection face 91a being a bottom face having a rectangular shape; a top face 91b opposite to terminal projection face 91a; two side faces 91c and 91d along long sides of terminal projection face 91a; and two end faces 91e and 91f along short sides of terminal projection face 91a. Relay case 91 contains the contact part and an electromagnet, wherein the electromagnet is structured to open and close the contact part. As described below, the contact part is located nearer to a first longitudinal end of relay case 91 than to a second longitudinal end of relay case 91, namely, nearer to end face 91e.

Each relay 51 further includes relay terminals 93, 94, 95, and 96, i.e. a pair of contact-part-connecting terminals 93 and 94 and a pair of coil-connecting terminals 95 and 96, which project from terminal projection face 91a, wherein contact-part-connecting terminals 93 and 94 are connected to the contact part inside of relay 51, and wherein coil-connecting terminals 95 and 96 are connected the electromagnet inside of relay 51. Specifically, the pair of coil-connecting terminals 95 and 96 are arranged in parallel in a part of terminal projection face 91a nearer to end face 91e than to end face 91f. One contact-part-connecting terminal 93 is located substantially at a center of terminal projection face 91a, whereas the other contact-part-connecting terminal 94 is located at a part of terminal projection face 91a nearer to end face 91f than to end face 91e. Each of coil-connecting terminals 95 and 96 has a thin stick shape, whereas each of contact-part-connecting terminals 93 and 94 has a wide plate shape extending parallel to end faces 91e and 91f.

As clearly shown in FIG. 10, each thus-configured relay 51 is mounted on subassembly board 62 such that end face 91f is in contact with bottom wall 67 of subassembly board 62 and such that terminal projection face 91a is in contact with erect wall 68 of subassembly board 62. As shown in FIG. 14, erect wall 68 includes openings 73 through which terminals 93, 94, 95, and 96 of each relay 51 extend.

As shown in FIG. 11, subassembly board 62 includes eight relay-connecting terminals 75 (75A to 75H) each of which is adjacent to a corresponding one of openings 73. Each of relay-connecting terminals 75 is formed to correspond in shape to the corresponding one of terminals 93, 94, 95, and 96 of relays 51, and project outward from erect wall 68. As shown in FIG. 10, when relays 51 are mounted on subassembly board 62, each of terminals 93, 94, 95, and 96 of relays 51 is aligned with and welded (by TIG welding for example) to the corresponding one of relay-connecting terminals 75. The welding among the terminals fixes relays 51 on subassembly board 62.

Subassembly board 62 further includes two thermal-mass-element-connecting terminals 76 (76A and 76B) extending from end wall 69 of subassembly board 62 above the thermal-mass-element supporter 71. Each of thermal-mass-element-connecting terminals 76 is formed to have an L-shaped head. These heads are respectively welded (by TIG welding for example) to wire ends 54a and 54b of coil-shaped thermal mass element 54. This welding fixes thermal mass element 54 on subassembly board 62.

On the other hand, as shown in FIGS. 11, 13, and 14, bottom wall 67 of subassembly board 62 includes eight subassembly-side connection terminals 77 (77A to 77H), and thermal-mass-element supporter 71 includes four jumper-connecting terminals 78 (78A to 78D). Each of these twelve terminals 77 and 78 in total is formed to project perpendicularly from the downward face of bottom wall 67 or from the downward face of thermal-mass-element supporter 71. As shown in FIGS. 8 and 9, when subassembly 61, on which relays 51 and thermal mass element 54 are loaded, is mounted on plate base 41 of power module 16, each of subassembly-side connection terminals 77 and jumper-connecting terminals 78 extends through an opening (see elements 45 in FIGS. 8 and 9 for example) formed at a corresponding position in plate base 41, and is aligned with and welded (by TIG welding for example) to a corresponding one of power-module-side connection terminals (see elements 40a in FIGS. 8 and 9 for example) provided adjacent to the opening. Each of power-module-side connection terminals 40a is a part of bus bar 40 inserted in plate base 41, and is formed by cutting and substantially perpendicularly raising it from bus bar 40 that has a plate shape extending along the component mount side of plate base 41.

All of terminals 75, 76, 77, and 78 described above are configured to form a part of bus bars 65 inserted in subassembly board 62, wherein bus bars 65 serve as second wiring lines. Thus, electrical connection from bus bars 40, which serve as the wiring of power module 16, to relays 51 and thermal mass element 54 on subassembly board 62 is established via bus bars 65 of subassembly board 62.

Jumper-connecting terminals 78 (78A to 78D) are simply provided as both ends of a pair of bus bars 65 (65A in FIG. 9) serving as jumpers. This allows subassembly 61 to serve as a jumper.

Eight subassembly-side connection terminals 77 (77A to 77H) are formed to project from a downward face of relay container space 70 of subassembly board 62 and have positions and shapes which are substantially equivalent to those of terminals 93, 94, 95, and 96 of two relays 51. Specifically, subassembly-side connection terminals 77A, 77B, 77E, and 77F have positions and shapes corresponding to coil-connecting terminals 95 and 96, and subassembly-side connection terminals 77C, 77D, 77G, and 77H have positions and shapes corresponding to contact-part-connecting terminals 93 and 94. In other words, subassembly-side connection terminals 77 (77A to 77H) are formed in conformance with a configuration that openings 45 and power-module-side connection terminals 40a of power module 16 are formed to alternatively allow each relay 51 to be directly mounted on plate base 41 of power module 16 in an attitude that terminal projection face 91a of each relay 51 faces the component mount side of plate base 41.

The following describes connection relations among relays 51, thermal mass element 54, and connection terminals 76 and 77 in subassembly 61, namely, describes wiring of bus bars 65. Contact-part-connecting terminals 93 and 94 of backup-power-supply relay 51B are respectively connected to subassembly-side connection terminals 77C and 77D, wherein these terminals 77C and 77D are located beneath backup-power-supply relay 51B (see FIG. 13) and correspond to the contact-part-connecting terminals. Coil-connecting terminals 95 and 96 of backup-power-supply relay 51B are respectively connected to subassembly-side connection terminals 77A and 77B, wherein these terminals 77A and 77B are located beneath backup-power-supply relay 51B and correspond to the coil-connecting terminals. Thus, bus bars 65 of subassembly 61 are configured such that, while backup-power-supply relay 51B, which is mounted to power module 16 via subassembly board 62, is supported in an attitude that terminal projection face 91a is raised (preferably perpendicularly) with respect to the component mount side of power module 16, each of terminals 93, 94, 95, and 96 projecting sideways is electrically connected to a corresponding one of four power-module-side connection terminals 40a (see FIG. 8) of power module 16 beneath backup-power-supply relay 51B.

Similarly, coil-connecting terminals 95 and 96 of main-power-supply relay 51A are respectively connected to subassembly-side connection terminals 77E and 77F, wherein these terminals 77E and 77F are located beneath main-power-supply relay 51A and correspond to the coil-connecting terminals. On the other hand, one of contact-part-connecting terminals 93 and 94 of main-power-supply relay 51A is connected to one of thermal-mass-element-connecting terminals 76A and 76B via an inside of subassembly board 62. The other of contact-part-connecting terminals 93 and 94 of main-power-supply relay 51A is connected to subassembly-side connection terminal 77G, wherein this terminal 77G is one of the two terminals beneath main-power-supply relay 51A and corresponds to the contact-part-connecting terminals. The other of thermal-mass-element-connecting terminals 76A and 76B is connected to subassembly-side connection terminal 77H, wherein this terminals 77H is the other of the two terminals beneath main-power-supply relay 51A and corresponds to the contact-part-connecting terminals.

In a state that subassembly 61 is mounted on power module 16, subassembly-side connection terminal 77H is connected to main-power-supply connector terminal 30 of external connector 24 via bus bars 40 of power module 16. On the other hand, subassembly-side connection terminal 77G is suitably connected to bus bars 40 of power module 16 and serves as a power-supply output terminal via main-power-supply relay 51A. Therefore, when the main switch (so-called key switch) of the vehicle has become ON and main-power-supply relay 51A has closed, the electric power starts to be supplied via coil-shaped thermal mass element 54.

Incidentally, as shown in FIG. 9, power module 16 includes relay hold walls 80 formed to stand along the side faces 91c and 91d of relays 51. Relay hold walls 80 located between two relays 51 extend into relay container space 70 through an opening 81 (see FIGS. 12 and 13) formed rectangular in bottom wall 67 of subassembly board 62.

Figure 16:
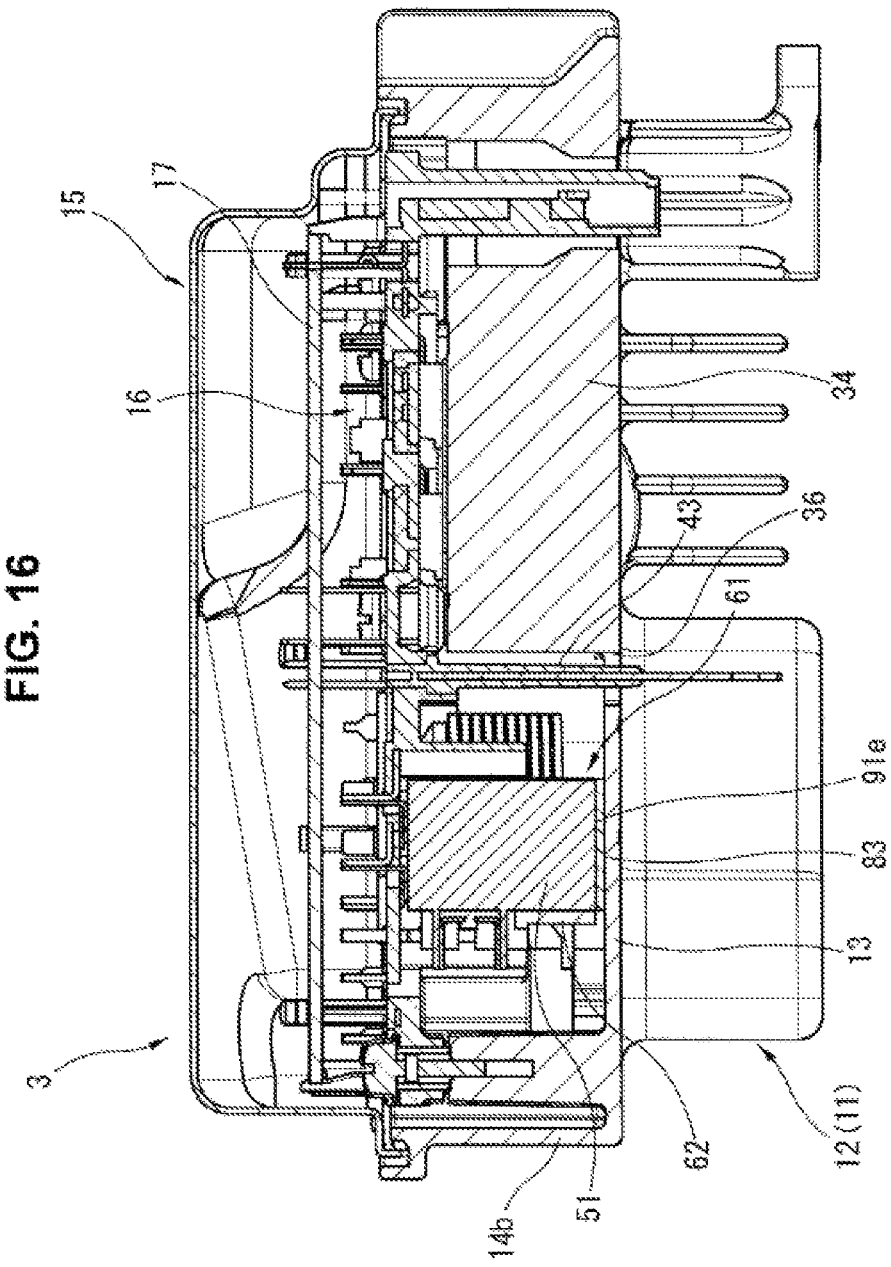
FIG. 16 is a sectional view of the motor control device in its entirety.

FIG. 16 is a sectional view of the whole of motor control device 3 that has been assembled. FIG. 16 shows motor control device 3 in the same upward and downward directions as when mounted in the vehicle, as well as FIGS. 1 and 2. Accordingly, power module 16 is contained in housing 11 so as to direct downward the component mount side including relays 51 etc. Each of the pair of relays 51 is in an inverted attitude to direct downward the end face 91e exposed outside of relay container space 70 of subassembly board 62, such that end face 91e faces bottom wall 13 of case 12, specifically, an area of bottom wall 13 between stator-terminal insertion hole 36 and second wall 14b. Between end faces 91e and bottom wall 13, a thermal conductive sheet 83 is provided as a thermal conductor and has a rectangular shape. Thermal conductive sheet 83 is made of a material high in thermal conductivity such as a rubbery material or a silicon-based material, and has flexibility and surface adhesiveness. Thermal conductive sheet 83 is slightly compressed between end faces 91e of relays 51 and an inner face of bottom wall 13, and thereby adheres to end faces 91e and the inner face of bottom wall 13. Thus, end faces 91e of relays 51 are thermally connected to bottom wall 13 of case 12.

Figure 17:
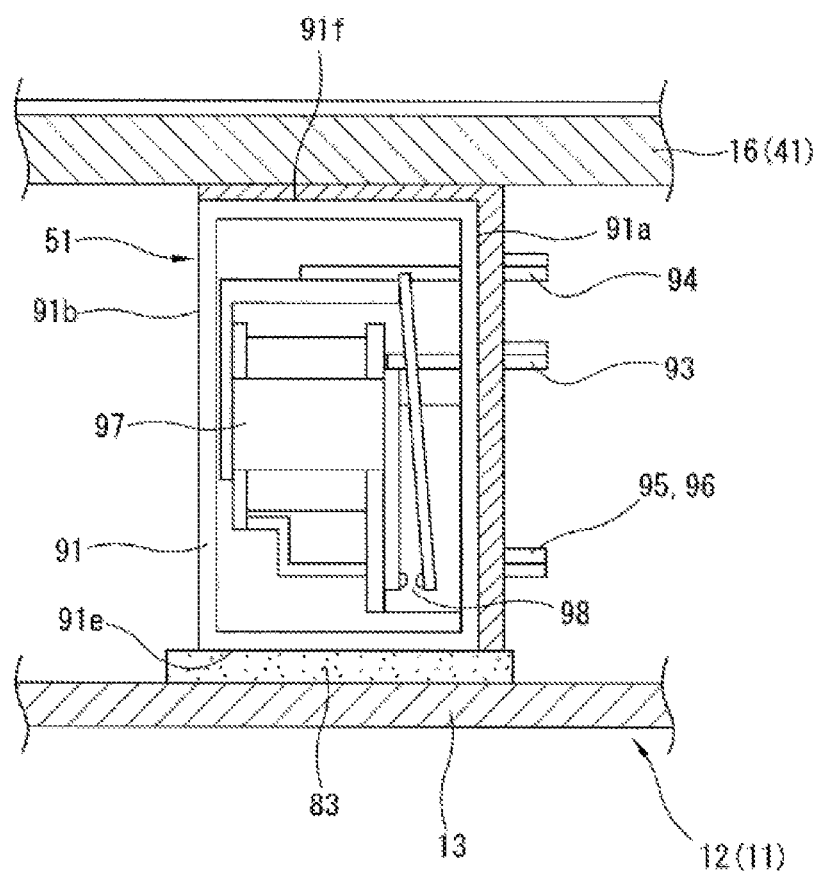
FIG. 17 is a schematic view of the relay, illustrating its internal structure.

FIG. 17 is a schematic view of one of relays 51 for illustrating its internal structure with housing 11 etc. Each relay 51 includes electromagnet 97 and contact part 98 inside of relay case 91, wherein contact part 98 is structured to be opened and closed by electromagnet 97. As described above, in relay case 91 having a rectangular-prism shape, contact part 98 is located nearer to the first longitudinal end of relay case 91 than to the second longitudinal end of relay case 91, namely, nearer to end face 91e that is directed downward when mounted in the vehicle.

The configuration according to the first embodiment described above serves to effectively suppress dew condensation at contact part 98 of each relay 51 (especially main-power-supply relay 51A) in an extremely cold area.

Although relay case 91 of each relay 51 has a sealed structure, relay case 91 allows moisture around it to permeate inside it because relay case 91 is formed of a synthetic resin having moisture-permeability. For example, in a case of an extremely cold area reachable to 20° C. below the freezing point, while the vehicle is being driven (i.e. during operation of motor control device 3), an internal temperature of housing 11 of motor control device 3 is around 0° C. to 5° C. and moisture inside relay case 91 is thereby in a gaseous state. However, after the driving of the vehicle has been ended and the power supply of motor control device 3 has been shut off, a temperature of contact part 98 drops below the freezing point wherein contact part 98 is thermally connected to outside air via the metallic components such as the connector terminal (main-power-supply connector terminal 30) and bus bars 40 of power module 16, and thereby the gaseous moisture inside relay case 91 is liable to condense at contact part 98. Each of contact points of contact part 98 is so small in thermal capacity as to easily allow the dew condensation to occur on its surface. The occurrence of dew condensation in this way while the vehicle is at rest is undesirable, because such dew condensation is liable to cause a contact failure at contact part 98 when main-power-supply relay 51A is operated to close for starting the vehicle.

With regard to this problem, according to the configuration of the first embodiment, thermal mass element 54, which has a large thermal capacity, is interposed between main-power-supply connector terminal 30 and main-power-supply relay 51A, and thereby allows the temperature of contact part 98 to drop more slowly after shutoff of the power supply of motor control device 3 in an extremely cold area. Making the temperature drop of contact part 98 slower than temperature drop of relay case 91 serves to make the gaseous moisture inside relay case 91 condense on an inner surface of relay case 91 and thereby suppress dew condensation at contact part 98.

In particular, the configuration of the first embodiment that subassembly 61 is composed of relays 51 and others such that bus bars 65 are interposed as second wiring lines between main-power-supply connector terminal 30 and thermal mass element 54 and between thermal mass element 54 and main-power-supply relay 51A, serves to elongate a thermal transfer route between contact part 98 and outside air, and thereby further allow the temperature of contact part 98 to drop more slowly. Moreover, as clearly shown in FIGS. 4 and 5, the configuration of the first embodiment that thermal mass element 54 is located opposite to main-power-supply connector terminal 30 with respect to main-power-supply relay 51A, serves to elongate a wiring route (including bus bars 40 and bus bars 65) from main-power-supply connector terminal 30 to main-power-supply relay 51A via thermal mass element 54, i.e., to elongate the thermal transfer route between contact part 98 and outside air. This is a further advantage in suppressing the temperature drop of contact part 98. Furthermore, the configuration of the first embodiment that thermal mass element 54 is coil-shaped, allows the electrical insulation coat between adjacent two sections of the coiled wire to serve as a layer for thermal insulation, and thereby sets the thermal transfer route equivalent in length to the coiled wire. This is a still further advantage.

As shown in FIG. 17, each relay 51 is disposed in an attitude that the longitudinal direction of relay case 91 is vertical and contact part 98 is located in a lower half of relay case 91. This gives an advantage in moisture distribution inside the relay case 91. Specifically, the attitude where the longitudinal direction of relay case 91 is vertical, serves to set a large temperature difference (difference in air temperature) between the upper and lower sides inside the relay case 91 during operation, and also serves to set an air temperature of a vicinity of contact part 98 relatively low inside the relay case 91. This serves to accelerate a temperature drop of air in the vicinity of contact part 98 which is cooled by outside air (via air inside the housing 11, as strictly described) after motor control device 3 is turned OFF, and thereby suppress dew condensation at contact part 98.

Furthermore, according to the first embodiment, end face 91e of relay case 91 is thermally connected to case 12 via thermal conductive sheet 83, wherein case 12 is made of metal and exposed to outside air. This serves to accelerate a drop in temperature of end face 91e and make the gaseous moisture inside the relay case 91 condense on an inner surface of end face 91e, and thereby serves also to accelerate the drop in air temperature of the vicinity of contact part 98.

According to the first embodiment, as described above, plate base 41 itself of power module 16 is structured to be capable of directly mounting the pair of relays 51 thereon, but is employed to mount thermal mass element 54 thereon via subassembly 61. Accordingly, this allows component sharing between power module 16 configured without thermal mass element 54 and power module 16 configured with thermal mass element 54 for extremely cold areas.

Figure 18:
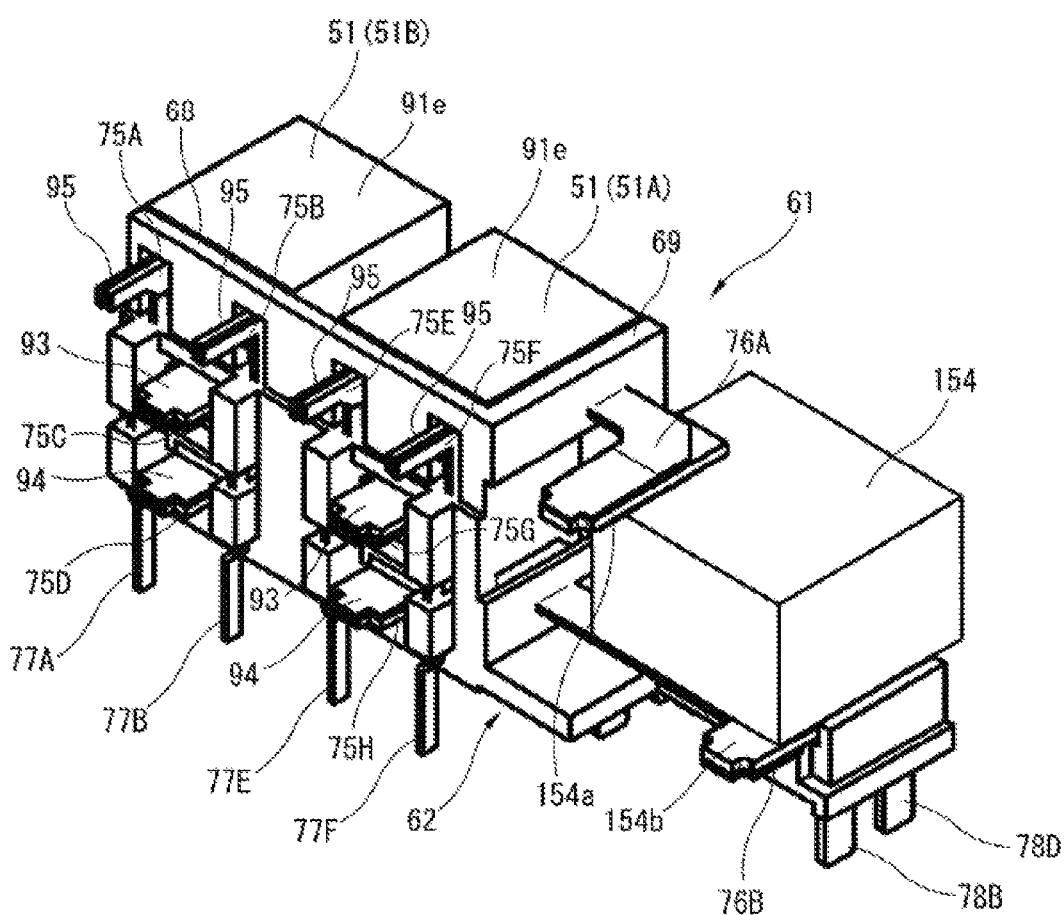
FIG. 18 is a perspective view of a subassembly according to a second embodiment of the present invention.

FIG. 18 shows a second embodiment in which a thermal mass element 154 is formed to have a rectangular block shape, and is mounted on subassembly board 62 as a component of subassembly 61. Thermal mass element 154 of the second embodiment is formed of conductive metal such as copper into the block shape, and includes two tabs 154a and 154b each of which is formed to project from a surface of thermal mass element 154. Thermal mass element 154 is located on thermal-mass-element supporter 71 of subassembly board 62, and tabs 154a and 154b are respectively welded (by TIG welding for example) to thermal-mass-element-connecting terminals 76A and 76B extending from end wall 69 of subassembly board 62. This welding serves to fix the thermal mass element 154 to subassembly board 62. Whereas coil-shaped thermal mass element 54 of the first embodiment described above acts as a kind of coil in the wiring route and needs a countermeasure to avoid affecting various characteristics, block-shaped thermal mass element 154 of the second embodiment causes no such effect as a coil and has an advantage in this point. Also thermal mass element 154 preferably has a surface coated with an insulator.

The thermal mass element is not limited to thermal mass element 54 nor thermal mass element 154 according to the above embodiments, but may be configured in various modes.

The present invention may be applied not only to motor control device 3 for the electric brake booster according to the above embodiments but also to various electronic control devices.

An electronic control device according to the above embodiments may be exemplified as follows.

According to one aspect of the present invention, the electronic control device includes: a relay including a relay case and an electromagnet and a contact part, wherein the relay case is structured to contain the electromagnet and the contact part, and wherein the contact part is structured to be opened and closed by action of the electromagnet; a connector terminal electrically connected to the relay; a circuit board structured to mount the relay and the connector terminal thereon; an exterior shell structured to contain the circuit board such that the connector terminal is exposed outside the exterior shell; and a thermal mass element disposed in a wiring route between the relay and the connector terminal.

According to a preferable aspect of the present invention, the relay further includes, as a face of the relay case, a terminal projection face from which a terminal of the relay projects outward. The relay is supported in an attitude that the terminal projection face is raised with respect to a component mount side of the circuit board. The terminal of the relay is electrically connected to a wiring line of the circuit board via a second wiring line, wherein the second wiring line is raised from the component mount side of the circuit board.

Further preferably, the electronic control device includes a subassembly board including the second wiring line, wherein the subassembly board is structured to mount the relay and the thermal mass element thereon and be mounted on the circuit board.

Further preferably, the relay case has a rectangular prism shape, and the contact part of the relay is located nearer to a first longitudinal end of the relay case than to a second longitudinal end of the relay case. The relay is supported by the circuit board in the attitude such that the contact part is in a lower half of the relay case when in use.

According to another preferable aspect of the present invention, the electronic control device further includes a thermal conductor disposed between an inner periphery of the exterior shell and a face of the relay case facing the inner periphery of the exterior shell.

According to still another preferable aspect of the present invention, the thermal mass element forms a part of the wiring route between the relay and the connector terminal, and has an insulator-coated surface.

Further preferably, the thermal mass element is composed of a coil-shaped member formed by coiling a copper wire.

The invention claimed is:

1. An electronic control device comprising: a relay including a relay case and an electromagnet and a contact part, wherein the relay case is structured to contain the electromagnet and the contact part, and wherein the contact part is structured to be opened and closed by action of the electromagnet; a connector terminal electrically connected to the relay; a circuit board structured to mount the relay and the connector terminal thereon; an exterior shell structured to contain the circuit board such that the connector terminal is exposed outside the exterior shell; and a thermal mass element disposed in a wiring route between the relay and the connector terminal.

2. The electronic control device according to claim 1, wherein:
the relay further includes, as a face of the relay case, a terminal projection face from which a terminal of the relay projects outward;
the relay is supported in an attitude that the terminal projection face is raised with respect to a component mount side of the circuit board; and
the terminal of the relay is electrically connected to a wiring line of the circuit board via a second wiring line, wherein the second wiring line is raised from the component mount side of the circuit board.

3. The electronic control device according to claim 2, further comprising:
a subassembly board including the second wiring line, wherein the subassembly board is structured to mount the relay and the thermal mass element thereon and be mounted on the circuit board.

4. The electronic control device according to claim 3, wherein:
the relay case has a rectangular prism shape;
the contact part of the relay is located nearer to a first longitudinal end of the relay case than to a second longitudinal end of the relay case; and
the relay is supported by the circuit board in the attitude such that the contact part is in a lower half of the relay case when in use.

5. The electronic control device according to claim 2, wherein:
the relay case has a rectangular prism shape;
the contact part of the relay is located nearer to a first longitudinal end of the relay case than to a second longitudinal end of the relay case; and
the relay is supported by the circuit board in the attitude such that the contact part is in a lower half of the relay case when in use.

6. The electronic control device according to claim 1, further comprising a thermal conductor disposed between an inner periphery of the exterior shell and a face of the relay case facing the inner periphery of the exterior shell.

7. The electronic control device according to claim 1, wherein:
the thermal mass element forms a part of the wiring route between the relay and the connector terminal; and
the thermal mass element has an insulator-coated surface.

8. The electronic control device according to claim 7, wherein the thermal mass element is composed of a coil-shaped member formed by coiling a copper wire.

* * * * *